(12) United States Patent
Kazama

(10) Patent No.: US 8,530,917 B2
(45) Date of Patent: Sep. 10, 2013

(54) OPTICAL SEMICONDUCTOR DEVICE HAVING AIR GAP FORMING REFLECTIVE MIRROR AND ITS MANUFACTURING METHOD

(75) Inventor: Takuya Kazama, Kawasaki (JP)

(73) Assignee: Stanley Electric Co., Ltd., Tokyo (JP)

(*) Notice: Subject to any disclaimer, the term of this patent is extended or adjusted under 35 U.S.C. 154(b) by 550 days.

(21) Appl. No.: 12/716,583

(22) Filed: Mar. 3, 2010

(65) Prior Publication Data
US 2010/0224898 A1   Sep. 9, 2010

(30) Foreign Application Priority Data
Mar. 4, 2009   (JP) .................... 2009-050466

(51) Int. Cl.
*H01L 33/00*   (2010.01)

(52) U.S. Cl.
USPC .......................................... 257/98; 362/612

(58) Field of Classification Search
USPC .......................................... 257/98; 362/612
See application file for complete search history.

(56) References Cited

U.S. PATENT DOCUMENTS

| | | | |
|---|---|---|---|
| 6,222,207 B1 | 4/2001 | Carter-Coman et al. | |
| 6,593,160 B2 | 7/2003 | Carter-Coman et al. | |
| 6,720,583 B2* | 4/2004 | Nunoue et al. ................. | 257/98 |
| 7,293,908 B2* | 11/2007 | Beeson et al. ................. | 362/612 |
| 2005/0139838 A1 | 6/2005 | Murata et al. | |
| 2005/0179130 A1 | 8/2005 | Tanaka et al. | |
| 2007/0086211 A1* | 4/2007 | Beeson et al. ................. | 362/628 |
| 2008/0197369 A1 | 8/2008 | Batres et al. | |

FOREIGN PATENT DOCUMENTS

| | | |
|---|---|---|
| JP | 07-193275 A | 7/1995 |
| JP | 08-116088 A | 5/1996 |
| JP | 08-316526 A | 11/1996 |
| JP | 10-125953 A | 5/1998 |
| JP | 10-341034 A | 12/1998 |
| JP | 2000-349349 A | 12/2000 |
| JP | 2002-185037 A | 6/2002 |
| JP | 2005-005679 A | 1/2005 |
| JP | 2006-086208 A | 3/2006 |
| JP | 2006-165257 A | 6/2006 |

(Continued)

OTHER PUBLICATIONS

U.S. Appl. No. 13/069,892; First Named Inventor: Takuya Kazama; Title: "Optical Semiconductor Device Including Protrusion Structure of Parallelogram Cells and Its Manufacturing Method"; filed Mar. 23, 2011.

(Continued)

*Primary Examiner* — Thao Le
*Assistant Examiner* — Geoffrey Ida
(74) *Attorney, Agent, or Firm* — Holtz, Holtz, Goodman & Chick, PC

(57) ABSTRACT

In an optical semiconductor device including an epitaxially-grown light emitting semiconductor layer and a reflective electrode layer provided at a counter face of the light emitting semiconductor layer opposing a light extracting face thereof, a support electrode layer is provided between the reflective electrode layer and the counter face of the light emitting semiconductor layer and is adapted to support the light emitting semiconductor layer and electrically connect the light emitting semiconductor layer to the reflective electrode layer. Also, a total area of the support electrode layer is smaller than an area of the reflective electrode layer. Further, an air gap at a periphery of the support electrode layer and the reflective electrode layer serves as a reflective mirror.

8 Claims, 20 Drawing Sheets

(56) References Cited

FOREIGN PATENT DOCUMENTS

| | | |
|---|---|---|
| JP | 2008-084973 A | 4/2008 |
| JP | 2008-098336 A | 4/2008 |
| JP | 2008-205475 A | 9/2008 |

OTHER PUBLICATIONS

Japanese Office Action dated Dec. 28, 2012 (and English translation thereof) in counterpart Japanese Application No. 2009-050466.

* cited by examiner

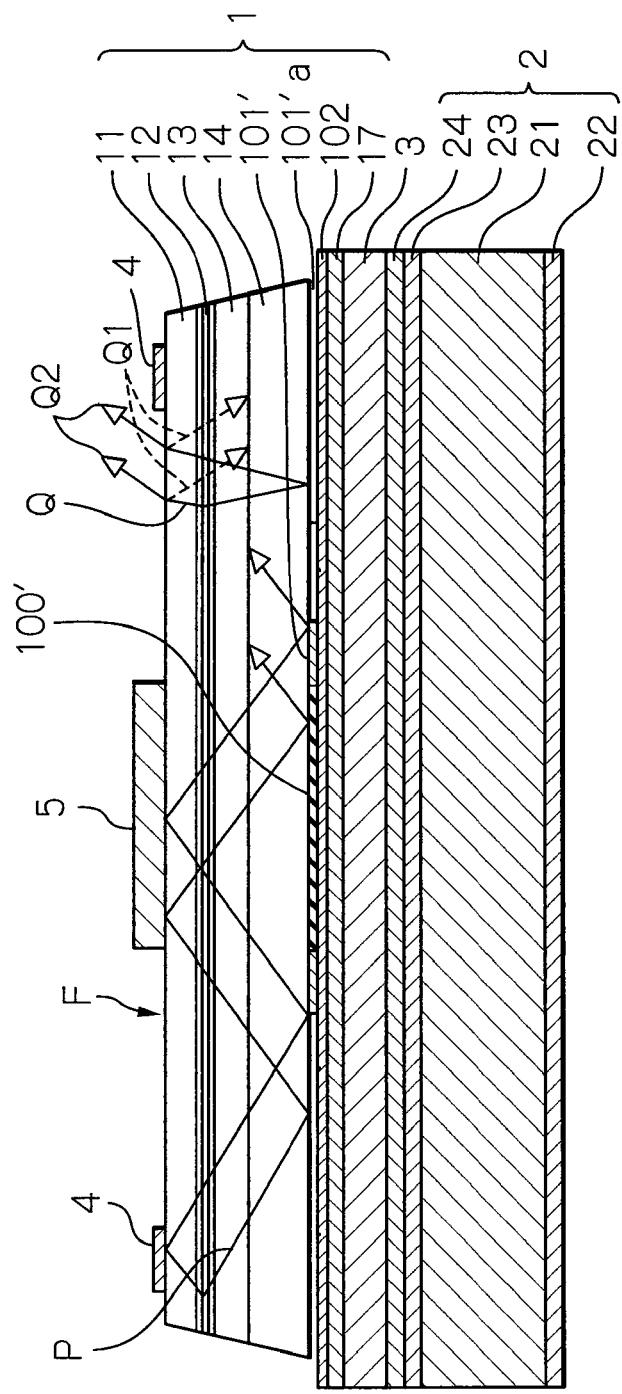

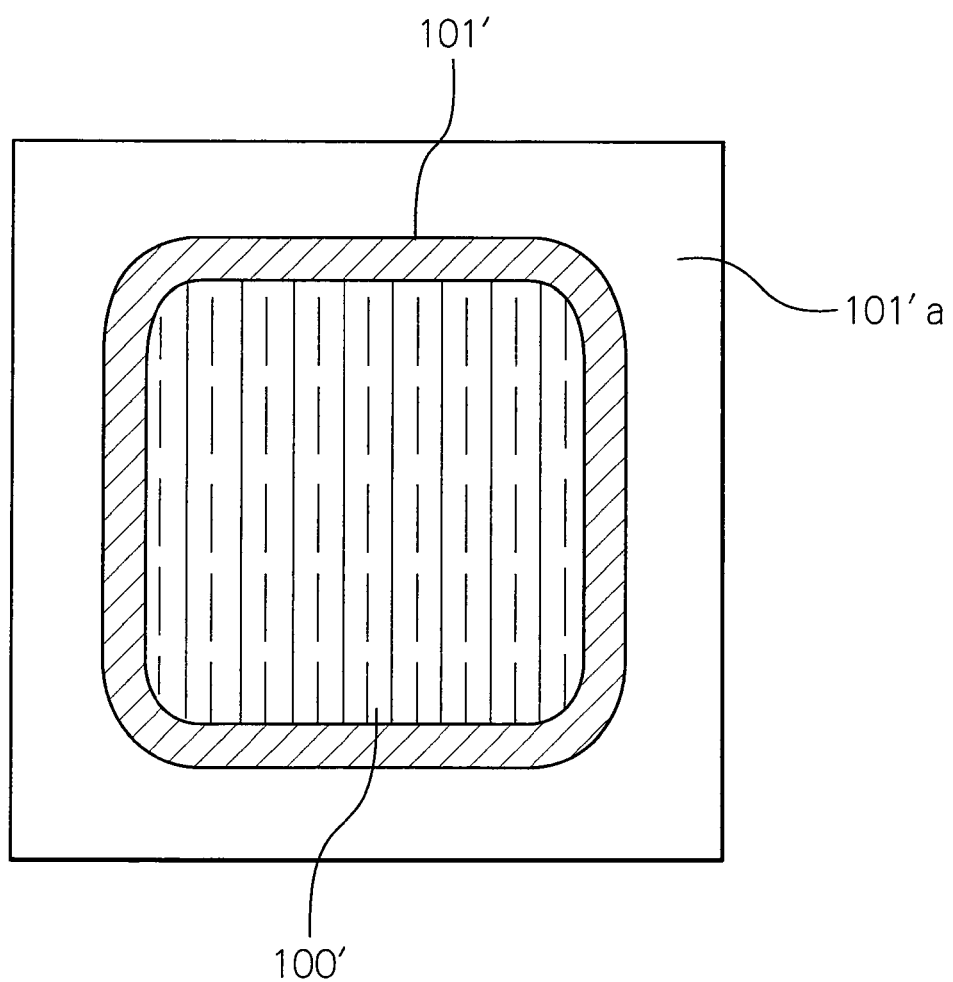

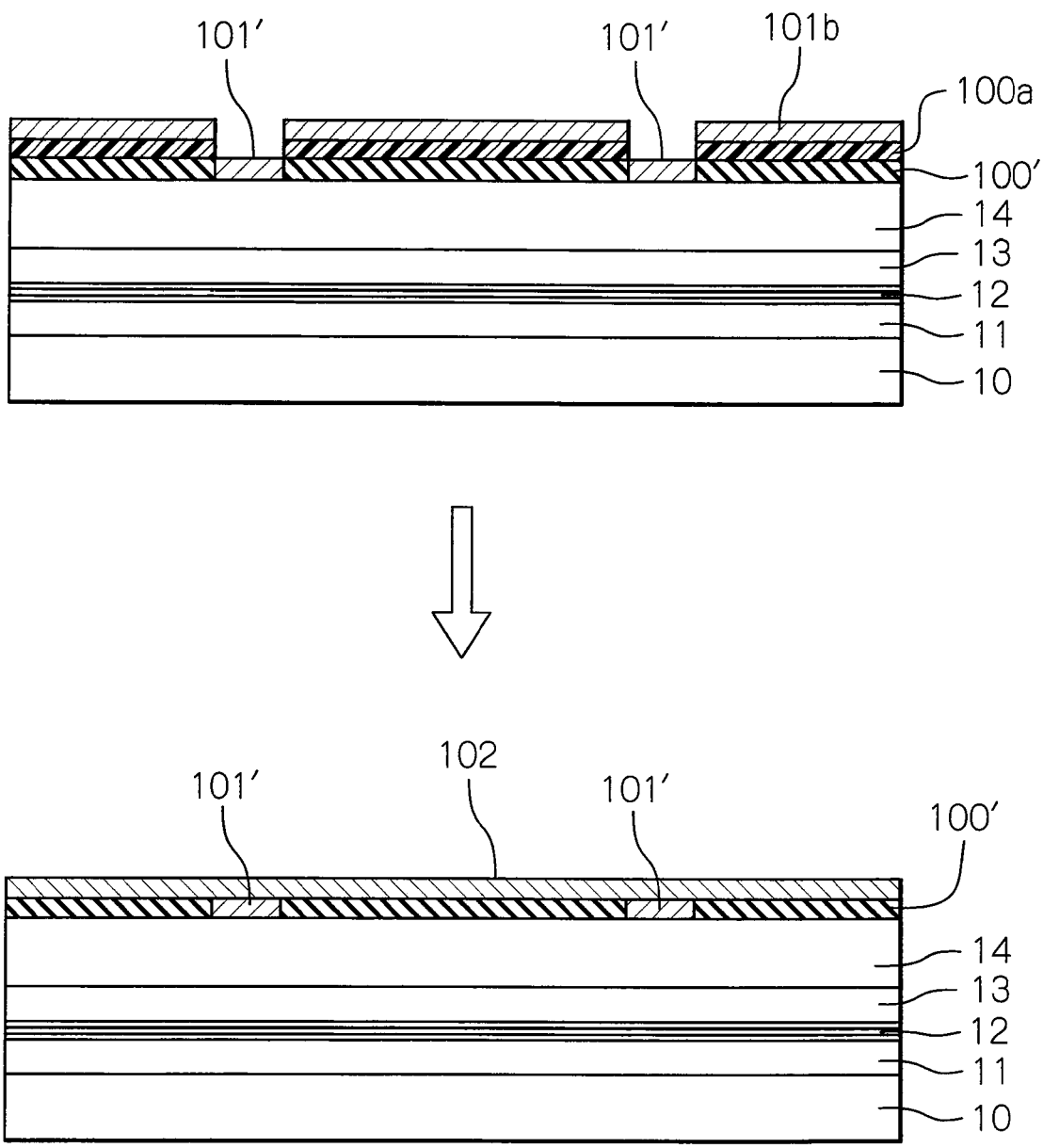

US 8,530,917 B2

OPTICAL SEMICONDUCTOR DEVICE HAVING AIR GAP FORMING REFLECTIVE MIRROR AND ITS MANUFACTURING METHOD

This application claims the priority benefit under 35 U.S.C. §119 to Japanese Patent Application No. JP2009-050466 filed on Mar. 4, 2009, which disclosure is hereby incorporated in its entirety by reference.

BACKGROUND

1. Field

The presently disclosed subject matter relates to an optical semiconductor device such as a light emitting diode (LED) and its manufacturing method.

2. Description of the Related Art

Generally, in a prior art optical semiconductor device, an AlGaInP light emitting layer lattice-matching with GaAs and a GaInP current spreading layer not lattice-matching with GaAs are sequentially and epitaxially grown on a semiconductor growing GaAs substrate. Then, a reflective mirror is deposited thereon by a chemical vapor deposition (CVD) process or a sputtering process, to obtain a semiconductor laminated body. Then, the semiconductor laminated body is bonded to a support body. Finally, the GaAs substrate for absorbing a visible light component of light emitted from the AlGaInP light emitting layer is wholly removed (see: JP2006-86208A and JP2008-98336A). Thus, since the visible light absorbing GaAs substrate is wholly removed, light radiated from the AlGaInP light emitting layer to the reflective mirror is totally reflected at the reflective mirror to reach a light extracting face opposing the reflective mirror, so that a part of the totally-reflected light is extracted therefrom to the exterior, which would improve the light extracting efficiency.

Another prior art optical semiconductor device uses a highly-reflective metal layer made of Ag, Au or Al as the above-mentioned reflective mirror (see: JP2000-349349A). In this case, the reflectivity of the metal layer has no dependence upon the incident angle of light from the AlGaInP light emitting semiconductor layer to the reflective mirror. However, since the reflectivity of the above-mentioned metal layer is about as large as 95%, the light from the AlGaInP light emitting semiconductor layer cannot be completely reflected at the reflective mirror, so that the light extracting efficiency is not so high.

A further other optical semiconductor device uses a combination of a silicon oxide ($SiO_2$) layer and a metal layer as the above-mentioned reflective mirror (see: JP2006-165257A). In this case, the reflectivity of the silicon oxide layer is about 100% for light incident thereto having an incident angle larger than the critical angle. This will be explained later in detail.

In the above-described further other prior art optical semiconductor device, however, the reflectivity drops in the proximity of the critical angle, so that the reflectivity is about as small as 75%. Also, the reflectivity is about as small as 96% in the incident angle from 0° to 15° smaller than the critical angle. As a result, the light extracting efficiency is still low. Further, the margin of the optimum thickness of the silicon oxide layer is so small that the manufacturing cost would be increased.

Note that JPHei7-193275A, JPHei8-116088A, JPHei8-316526A, JPHei10-125953A and JPHei10-341034A disclose an optical semiconductor device which is constructed by a light emitting semiconductor layer epitaxially-grown on a semiconductor growing substrate while an air gap is provided between the light emitting semiconductor layer and the semiconductor growing substrate. In this case, the air gap serves as a reflective mirror whose reflectivity is larger than that of silicon oxide ($SiO_2$). However, since the semiconductor growing substrate is not removed and the reflective mirror includes no reflective electrode layer for reflecting light penetrated through the air gap, the effective reflectivity of the reflective mirror regarding light whose incident angle is smaller than the critical angle is not so large, so that it is impossible to enhance the light extracting efficiency.

SUMMARY

The presently disclosed subject matter seeks to solve one or more of the above-described problems.

According to the presently disclosed subject matter, in an optical semiconductor device including an epitaxially-grown light emitting semiconductor layer and a reflective electrode layer provided at a counter face of the light emitting semiconductor layer opposing a light extracting face thereof, a support electrode layer is provided between the reflective electrode layer and the counter face of the light emitting semiconductor layer and is adapted to support the light emitting semiconductor layer and electrically connect the light emitting semiconductor layer to the reflective electrode layer. Also, a total area of the support electrode layer is smaller than an area of the reflective electrode layer. Further, an air gap at a periphery of the support electrode layer and the reflective electrode layer serves as a reflective mirror. Since the reflectivity of the air gap is larger than that of silicon oxide for light having a smaller incident angle than the critical angle, the effective reflectivity of the reflective mirror (the air gap and the reflective electrode layer) for the above-mentioned light can be increased. Also, since the range of thickness of the air gap with a large reflectivity is large, the margin of thickness of the air gap can be increased.

Also, the support electrode layer is of a non-closed structure. Further, the support electrode layer is of a closed loop structure in which porous silicon oxide is filled. In the latter case, the porous silicon oxide layer opposes a bonding pad formed on the light extracting face of the light emitting semiconductor layer. Thus, the porous silicon oxide supports the pressurizing force of the bonding pad.

In a method for manufacturing an optical semiconductor device according to the presently disclosed subject matter, a porous silicon oxide layer is formed on a counter face of a light emitting semiconductor layer opposing a light extracting face thereof. Then, an opening is perforated in the porous silicon oxide layer. Then, a block layer is filled in the opening. Then, a reflective electrode layer is formed on the block layer and the porous silicon oxide layer. Finally, after the block layer is filled, the porous silicon oxide layer is removed by a wet etching process using a capillary phenomenon. When the porous silicon oxide layer is removed, an air gap is formed. As a result, this air gap along with the reflective electrode layer serves as a reflective mirror.

Also, the opening is of a closed loop structure, and the block layer is of a closed loop structure, so that the porous silicon oxide layer is left within the closed loop structure of the block layer, after the wet etching process is carried out.

BRIEF DESCRIPTION OF THE DRAWINGS

The above and other advantages and features of the presently disclosed subject matter will be more apparent from the following description of certain embodiments, as compared with the prior art, taken in conjunction with the accompanying drawings, wherein:

FIG. 10 is a cross-sectional view illustrating a second embodiment of the optical semiconductor device according to the presently disclosed subject matter;

FIG. 11 is a plan view of the support electrode layer of FIG. 10;

FIG. 12 is a cross-sectional view for explaining a method for manufacturing the optical semiconductor device of FIG. 10;

DETAILED DESCRIPTION OF EXEMPLARY EMBODIMENTS

Before the description of exemplary embodiments, a prior art optical semiconductor device will now be explained with reference to FIGS. 1, 2, 3 and 4.

Figure 1:
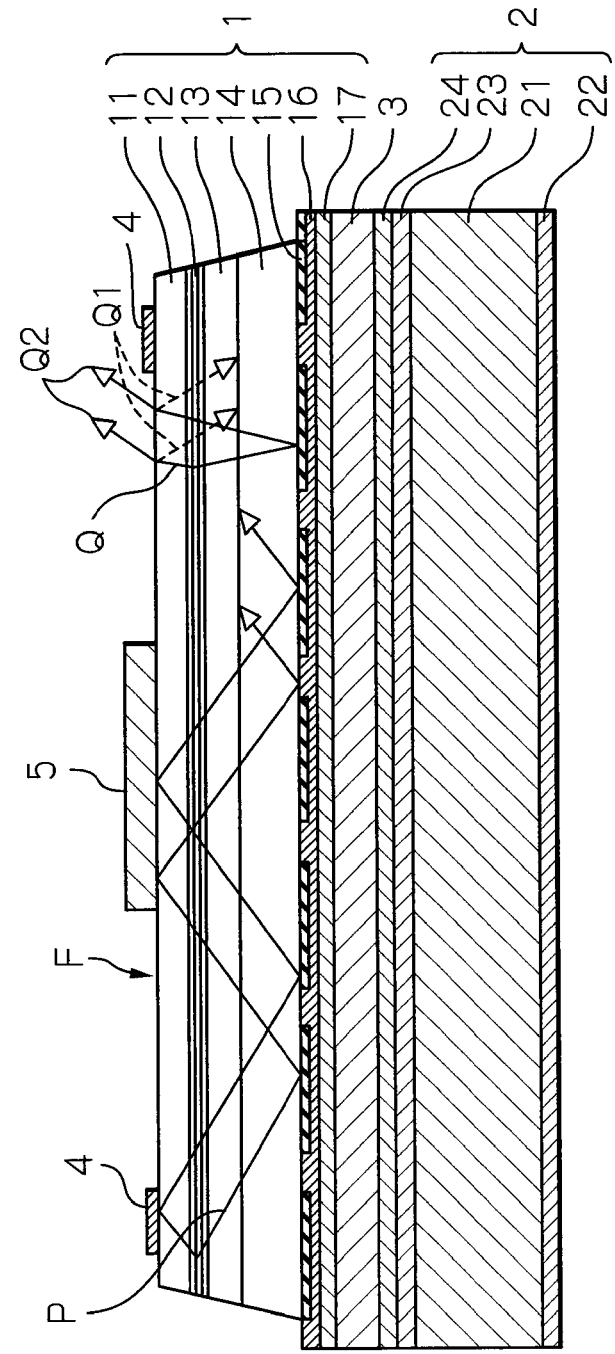
FIG. 1 is a cross-sectional diagram illustrating a prior art optical semiconductor device.

In FIG. 1, which illustrates a prior art optical semiconductor device (see: JP2006-165257A), this optical semiconductor device is constructed by a semiconductor laminated body 1, a support body 2, a eutectic bonding layer 3 for bonding the semiconductor laminated body 1 to the support body 2, an n-side electrode 4 and a bonding pad 5.

The semiconductor laminated body 1 includes semiconductor layers epitaxially-grown on a semiconductor growing GaAs substrate (not shown) using a metal organic chemical vapor deposition (MOCVD) process, i.e., an n-type AlGaInP layer 11, an AlGaInP active layer 12, a p-type AlGaInP layer 13 and a GaInP current spreading layer 14. In this case, the n-type AlGaInP layer 11, the AlGaInP active layer 12 and the p-type AlGaInP layer 13 form a double-heterostructured light emitting semiconductor layer. Also, the n-type AlGaInP layer 11, the AlGaInP active layer 12 and the p-type AlGaInP layer 13 lattice-match with GaAs, and are represented by $(Al_zGa_{1-z})_{1-x}In_xP$ ($0 \leq z \leq 1$, $0 \leq x \leq 1$). On the other hand, the GaInP current spreading layer 14 does not lattice-match with GaAs, and is represented by $Ga_{1-x}In_xP$ ($0 \leq x \leq 1$).

Additionally, the semiconductor laminated body 1 includes a patterned silicon oxide ($SiO_2$) layer 15 formed by a CVD process or the like beneath the GaInP current spreading layer 14 and an AuZn reflective electrode layer (p-side electrode) 16 formed by a sputtering process or the like beneath the silicon oxide layer 15. In this case, a combination of the silicon oxide layer 15 and the reflective electrode layer 16 serve as one reflective mirror. Generally, since the resistivity of the p-type AlGaInP layer 13 is larger than that of the n-type AlGaInP layer 11, the current density between the n-side electrode 4 and the reflective electrode layer (p-side electrode) 16 is larger in a central region than in peripheral region. Therefore, the GaInP current spreading layer 14 is operated to disperse the current concentration in the central region to substantially decrease the resistivity of the p-type AlGaInP layer 13, which would improve the light emitting efficiency.

Further, the semiconductor laminated body 1 includes a barrier layer 17 for suppressing the outgoing diffusion of material of the reflective electrode layer 16 and the incoming diffusion of eutectic material at a post-stage process. The barrier layer 17 is made of refractory metal such as Ta, Ti or W, or their nitride formed by a sputtering process.

Thus, the semiconductor laminated body 1 includes the silicon oxide layer 15, the reflective electrode layer 16 and the barrier layer 17, in addition to the semiconductor layers 11 to 14.

The support body 2 includes a conductive support substrate 21 made of a boron-highly-doped monocrystalline silicon or the like, a back electrode layer 22 formed on a face of the conductive support substrate 21, an intermediate electrode layer 23 formed on the other face of the conductive support substrate 21 and a contact layer 24.

The eutectic bonding layer 3 is made of AuSnNi or the like.

Figure 2:
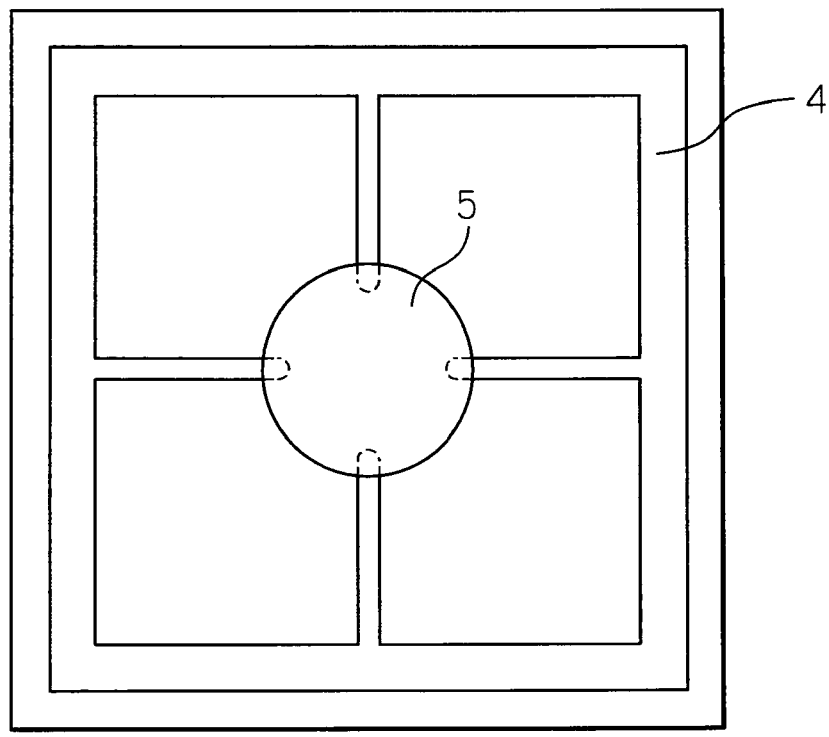
FIG. 2 is a plan view of the n-side electrode and the bonding pad of FIG. 1.

The n-side electrode 4 is made of AuGeNi or the like with ohmic contact characteristics with the n-type AlGaInP layer 11. Also, the bonding pad 5 is made of Au. As illustrated in FIG. 2, the n-side electrode 4 is located at a periphery of the device to diffuse currents within the device, while the bonding pad 5 is located at a center of the device and connected to the n-side electrode 4 to supply currents from the center of the device to the n-side electrode 4.

The periphery of the semiconductor layers 11 to 14 of the semiconductor laminated body 1 is mesa-etched, and then, the device is diced so as to be separated into individual chips. Finally, as occasion demands, the entirety of the device is resin-molded (not shown).

In FIG. 1, light P is emitted from the AlGaInP light emitting layer (11, 12, 13) and directly or indirectly incident to the light extracting face (upper face) F at an incident angle larger than the critical angle. This light P is multiply reflected between the light extracting face F and the reflective mirror, particularly, the silicon oxide layer 15 having a reflectivity of about 100%, so that the light P propagates traversely within the semiconductor layers 11 to 14 of the semiconductor laminated body 1. Finally, the light P is absorbed by the semiconductor layers 11 to 14 of the semiconductor laminated body 1, so that the light P cannot be extracted from the light extracting face F.

On the other hand, in FIG. 1, light Q is emitted from the AlGaInP light emitting layer (11, 12, 13) and directly or indirectly incident to the light extracting face (upper face) F at an incident angle smaller than the critical angle. A light component Q2 of the light Q except for its Fresnel component Q1 can be extracted from the light extracting face F.

Figure 3:
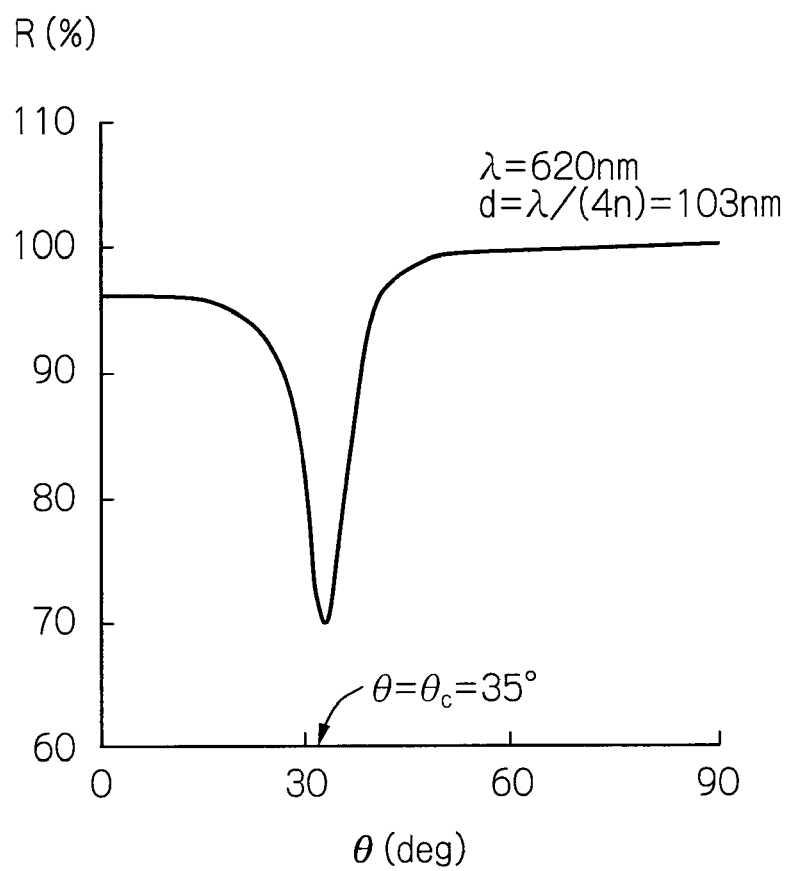
FIG. 3 is a graph showing the incident angle dependence characteristics of the reflectivity of the silicon oxide layer of FIG. 1.

In the optical semiconductor device of FIG. 1, however, as illustrated in FIG. 3, which shows the incident angle dependence characteristics of the reflectivity R of the silicon oxide layer 15 of FIG. 1, where the wavelength λ of emitted light in free space of the semiconductor layers 11 to 14 is 620 nm, the refractive index n of SiO$_2$ is 1.5, and the thickness d of the silicon oxide layer 15 is 103 nm (=λ/(4n)), the reflectivity R drops in the proximity of the critical angle θ$_c$ (=35°), so that the reflectivity R is about as small as 75%. Also, the reflectivity R is about as small as 96% in the incident angle θ from 0° to 15° smaller than the critical angle. As a result, when the above-mentioned light Q is reflected at the silicon oxide layer 15, a part of the light Q penetrates the silicon oxide layer 15 to reach the reflective electrode layer 16 which has a reflectivity of about 95%. Therefore, the reflectivity R of the light Q against the reflective mirror (15, 16) is not so large, which means that the light Q is not completely reflected by the reflective mirror (15, 16). Thus, the light extracting efficiency of the light Q is still low.

Figure 4:
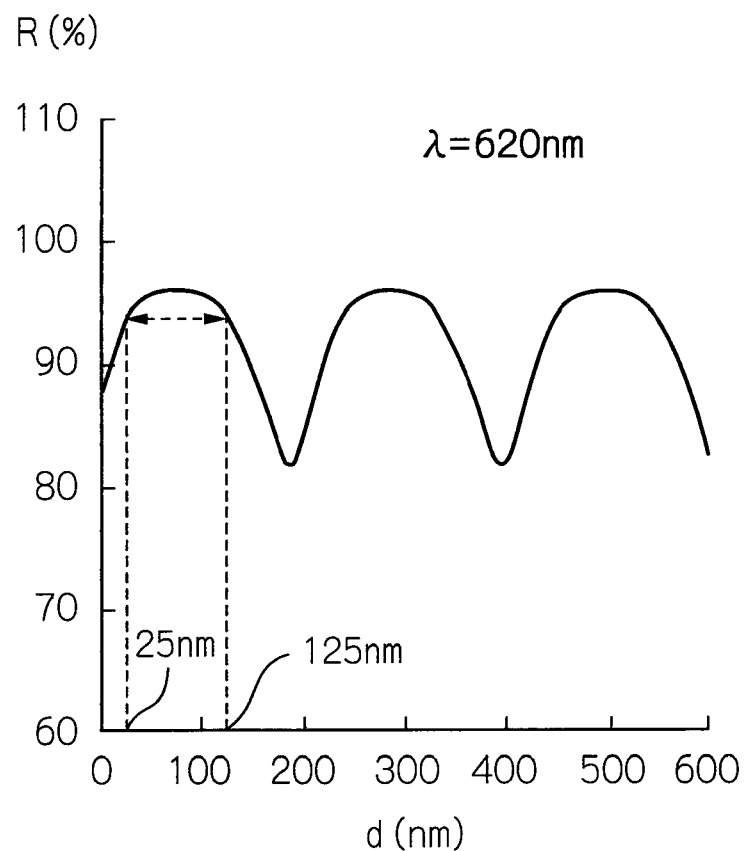
FIG. 4 is a graph showing the thickness dependence characteristics of the reflectivity of the silicon oxide layer of FIG. 1.

Also, the optimum thickness d of the silicon oxide layer 15 is represented by ●

$$d=Mλ/(n4)$$

where M is 1, 2, . . . . That is, as illustrated in FIG. 4, which shows the thickness dependence characteristics of the reflectivity R of the silicon oxide layer 15, a region of the thickness d where the reflectivity R is larger than 94% is very small, i.e., from 25 nm to 125 nm (λ/15~λ/3, M=1). As a result, the margin of the optimum thickness d is so small that the manufacturing cost would be increased.

Figure 5:
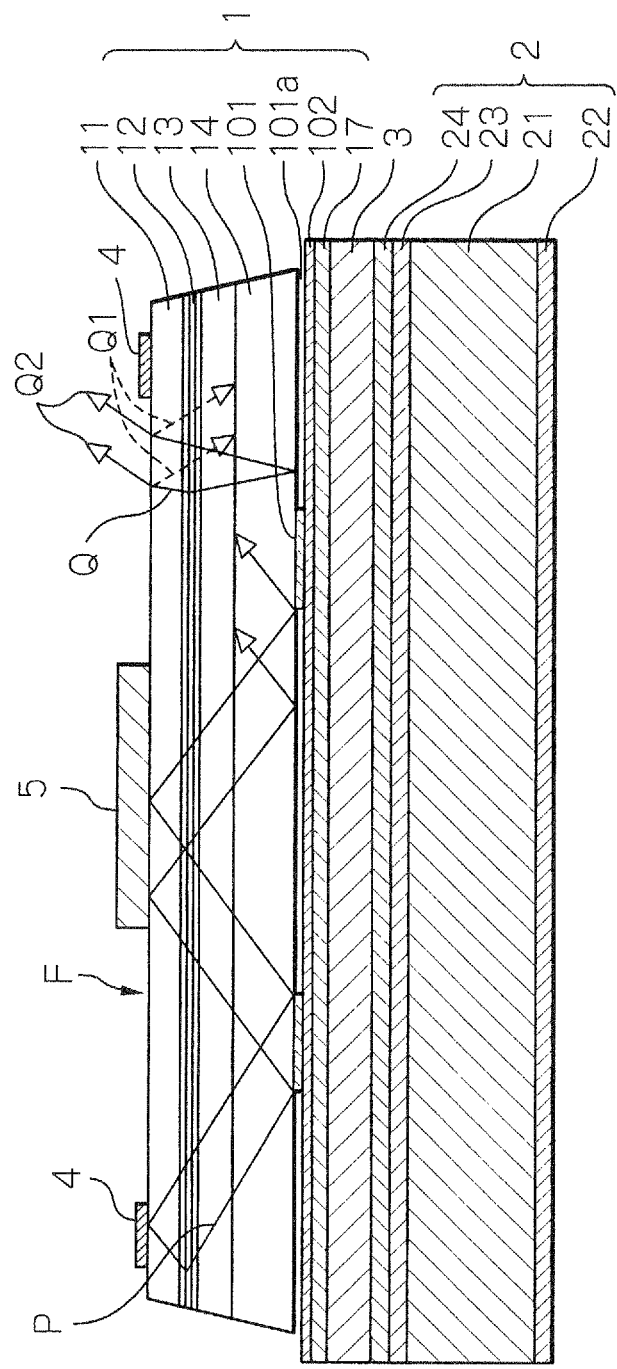
FIG. 5 is a cross-sectional view illustrating a first embodiment of the optical semiconductor device according to the presently disclosed subject matter.

In FIG. 5, which illustrates a first embodiment of the optical semiconductor device according to the presently disclosed subject matter, a support electrode layer 101 and a reflective electrode layer (p-side electrode) 102 are provided instead of the silicon oxide layer 15 and the reflective electrode layer 16 of FIG. 1. In this case, a total area of the support electrode layer 101 is smaller than an area of the reflective electrode layer 16. Therefore, the periphery of the support electrode layer 101 provides an air gap 101a. A combination of the air gap 101a and the reflective electrode layer 102 serves as a reflective mirror. Note that the support electrode layer 101 not only supports the semiconductor layers 11 to 14, but also serves as their electric contacts.

Figure 6:
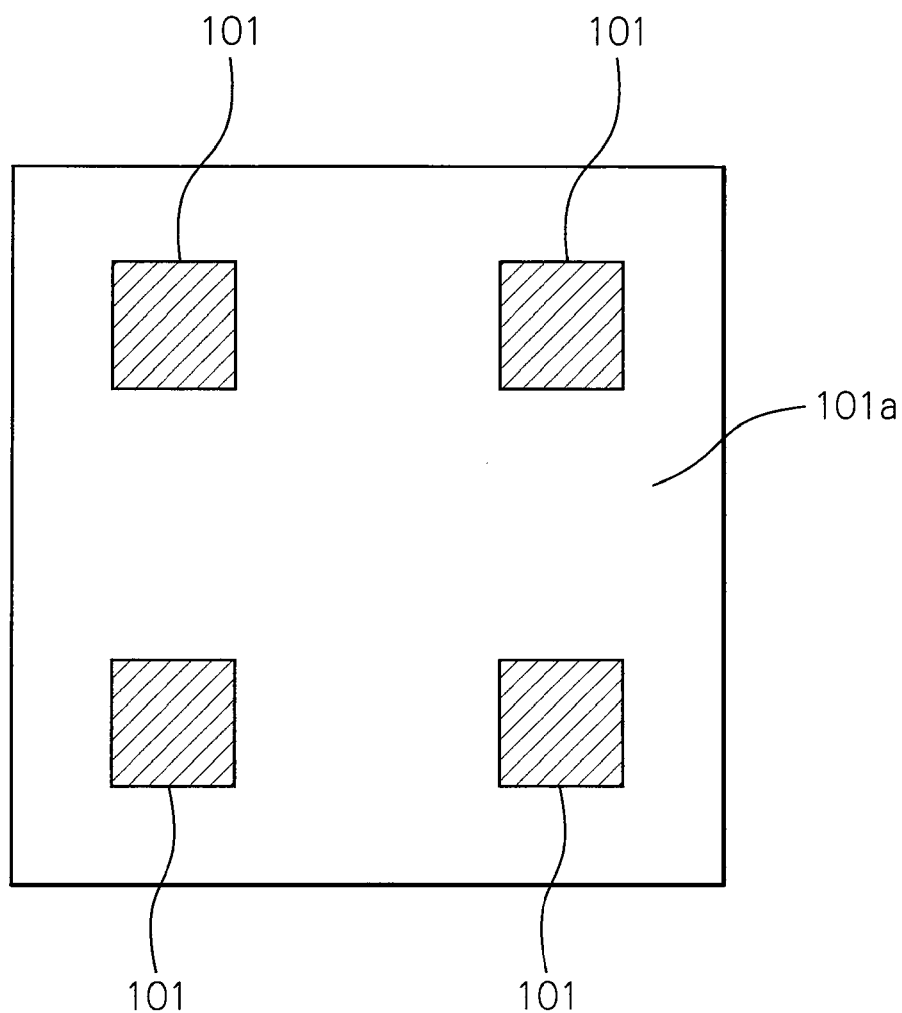
FIG. 6 is a plan view of the support electrode layer of FIG. 5.

In FIG. 6, which is a plan view of the support electrode layer 101 of FIG. 5, the support electrode layer 101 is formed by a non-closed loop structure of four columns which support the semiconductor layers 11 to 14.

The area of the support electrode layer 101 is optionally determined; in this case, the total area of the support electrode layer 101 is preferably larger than 10% of the chip area of the device in order to maintain the mechanical strength thereof.

Figure 7:
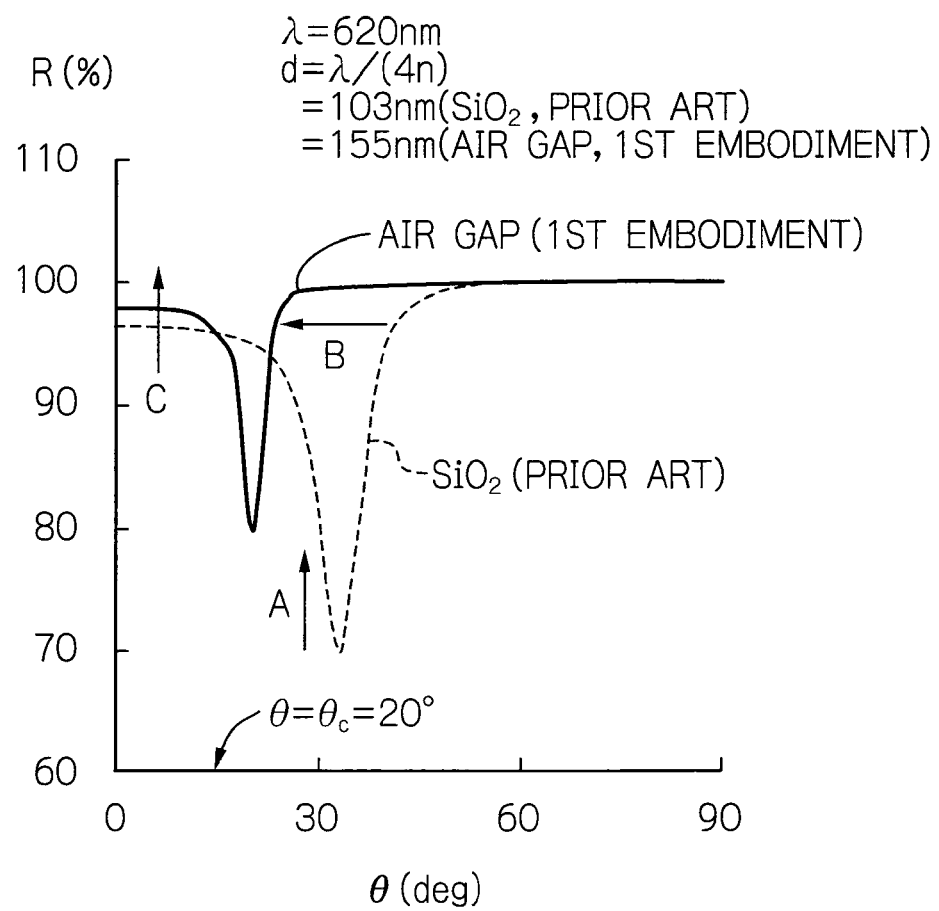
FIG. 7 is a graph showing the incident angle dependence characteristics of the reflectivity of the air gap of FIG. 5.

As illustrated in FIG. 7, which shows the incident angle dependence characteristics of the reflectivity R of the air gap 101a of FIG. 5, where the wavelength λ, of emitted light in free space of the semiconductor layers 11 to 14 is 620 nm, the refractive index n of air is 1.0, and the thickness d of the air gap 101a is 155 nm (=λ/(4n)), the reflectivity R drops in the proximity of the critical angle θ$_c$ (=20°), so that the reflectivity R is about as small as 80%, which is improved as compared with the prior art as indicated by arrow A in FIG. 7. Also, since the bottom peak of the reflectivity R is shifted to a smaller incident angle as compared with the prior art as indicated by arrow B in FIG. 7, the total reflection region can be increased. Further, the reflectivity R is increased to be about 98% at an incident angle such as 0° to 15° smaller than the critical angle θ$_c$ (=20°), as indicated by arrow C in FIG. 7. Note that the effect as indicated by arrow B is due to the air gap 101a, while the effect as indicated by arrows A and C is due to the air gap 101a and the reflective electrode layer 102. As a result, a large amount of the light Q is reflected at the air gap 101a, while a small amount of the light Q penetrates the air gap 101a to reach the reflective electrode layer 102 which has a reflectivity of about 95%. Therefore, the reflectivity R of the light Q against the reflective mirror (101a, 102) is quite large, which means that the light Q is completely reflected by the reflective mirror (101a, 102). Thus, the light extracting efficiency of the light Q can be increased.

Figure 8:
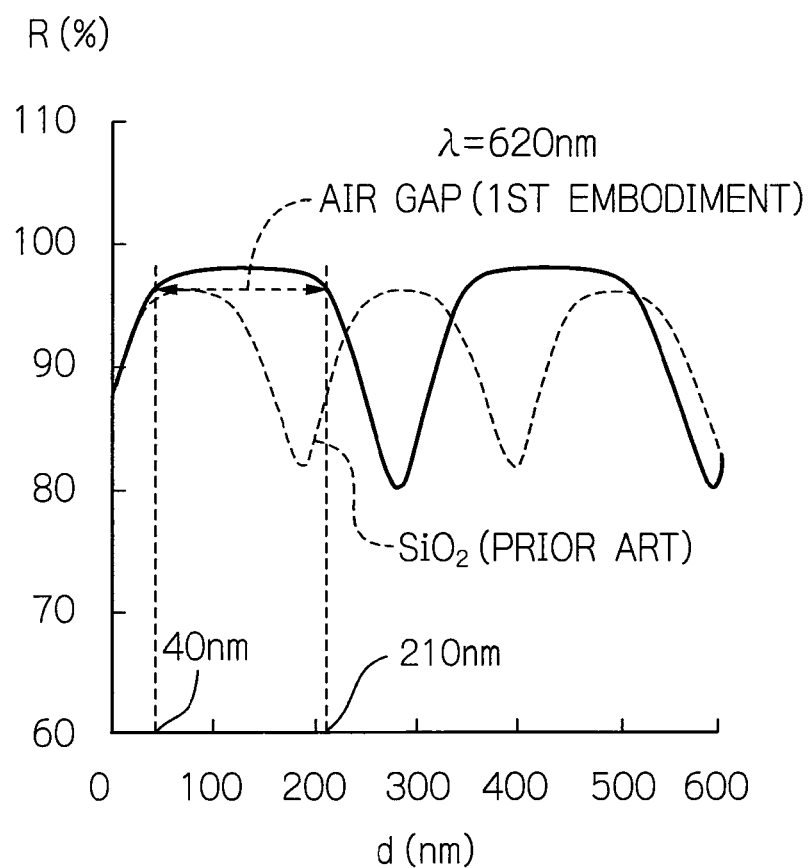
FIG. 8 is a graph showing the thickness dependence characteristics of the reflectivity of the air gap of FIG. 5.

Also, the optimum thickness d of the air gap 101a is represented by $$d=Mλ/(n4)$$

where M is 1, 2, . . . . That is, as illustrated in FIG. 8, which shows the thickness dependence characteristics of the reflectivity R of the air gap 101a of FIG. 6, a region of the thickness d where the reflectivity R is larger than 98% is very large, i.e., from 40 nm to 210 nm (λ/15~λ/3, M=1). As a result, the margin of the optimum thickness d is so large that the manufacturing cost would be decreased. Note that, the larger the thickness d, the smaller the mechanical strength of the device. Therefore, it is preferable that the thickness d be small. A method for manufacturing the optical semiconductor device of FIG. 5 will be explained next with reference to FIGS. 9A through 9K.

Figure 9A:
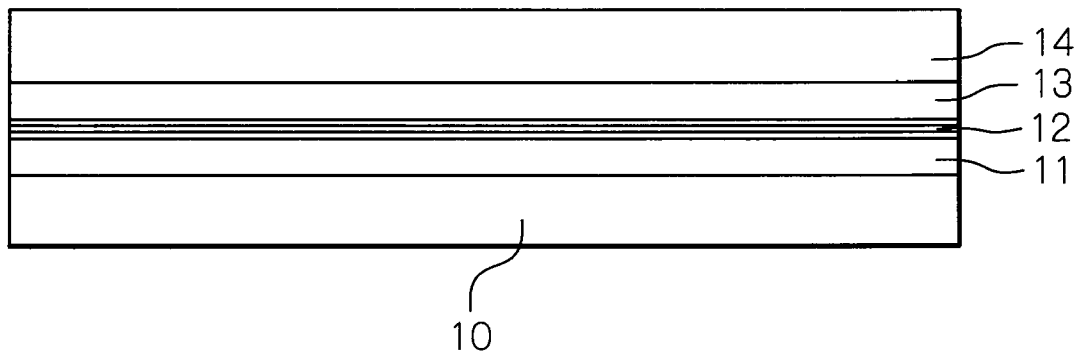
FIGS. 9A through 9K are cross-sectional views for explaining a method for manufacturing the optical semiconductor device of FIG. 5.

First, referring to FIG. 9A, an about 3.0 µm thick n-type $(Al_{0.7}Ga_{0.3})_{0.5}In_{0.5}P$ layer 11, an about 0.5 µm thick AlGaInP active layer 12 and an about 1.0 µm thick p-type $(Al_{0.7}Ga_{0.3})_{0.5}In_{0.5}P$ layer 13 are sequentially and epitaxially grown on a (100) face of an about 300 µm n-type GaAs substrate 10 having an OFF angle of 15° for growing semiconductors by an MOCVD process. The AlGaInP active layer 12 can be of a multiple quantum well (MQW) structure, of a single quantum well (SQW) structure or of a single layer. In this case, the n-type AlGaInP layer 11, the AlGaInP active layer 12 and the p-type AlGaInP layer 13 lattice-match with the GaAs substrate 10. For example, the MQW structure is formed by 15 pairs each including an about 20 nm thick $(Al_{0.1}Ga_{0.9})_{0.5}In_{0.5}P$ well layer and an about 10 nm thick $(Al_{0.56}Ga_{44})_{0.5}In_{0.5}P$ barrier layer. Note that the aluminum composition z of $(Al_zGa_{1-z})_{0.5}In_{0.5}P$ active layer 12 is adjusted from 0 to 0.4 in accordance with the wavelength λ of emitted light, and the aluminum composition z of the n-type AlGaInP layer 11 and the p-type $(Al_zGa_{1-z})_{0.5}In_{0.5}P$ layer 13 is adjusted from 0.4 to 1.0 in accordance with the wavelength λ of emitted light. Then, an about 10 µm thick $Ga_{1-x}In_xP$ current spreading layer 14 where x is 0.1 is further grown by the MOCVD process. In this case, the composition x of the $Ga_{1-x}In_xP$ is adjusted not to absorb light emitted from the light emitting semiconductor layer (11, 12, 13). Note that the GaInP current spreading layer 14 does not lattice-match with the GaAs substrate 10.

The OFF angle of the GaAs substrate 10 is a slope angle of the (100) face of the GaAs substrate 10. When growing AlGaInP on the GaAs substrate 10, its OFF angle is generally from 0° to 15° in view of the manufacturing easiness and stability. However, the presently disclosed subject matter is not limited to the above-mentioned OFF angle, and the OFF angle can be from 0° to 20°.

Figure 9B:
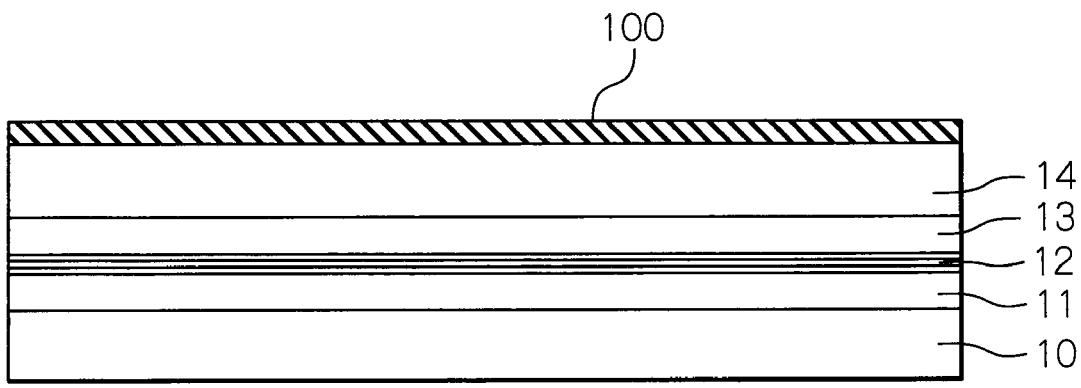

Next, referring to FIG. 9B, siloxane polymer is coated by a spin coating process on the GaInP current spreading layer 14, and then, is cured at a temperature of about 400° C. to form an about 40 to 210 nm thick porous silicon oxide (SiO$_2$) sacrifice layer 100. For example, the porous silicon oxide sacrifice layer 100 is about 150 nm thick and has voids whose size is several nm to several tens of nm. Note that the porous silicon oxide sacrifice layer 100 has a high chemical and thermal stability and is not subject to the heating process. Also, the porous silicon oxide sacrifice layer 100 has a high mechanical strength.

Figure 9C:
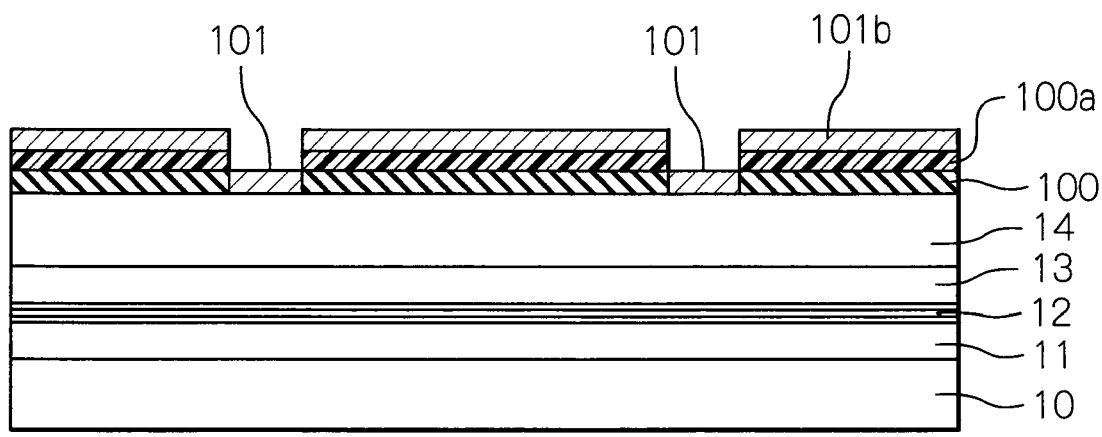

Next, referring to FIG. 9C, a photoresist pattern 100a is formed by a photolithography process on the porous silicon oxide sacrifice layer 100. Then, the porous silicon oxide sacrifice layer 100 is etched by buffered fluoric acid BHF using the photoresist pattern 100a as an etching mask. Then, an about 150 nm thick AuZn support electrode layers 101 and 101b is formed by an electron beam (EB) evaporating process or a sputtering process. Then, the support electrode layer 101b on the porous silicon oxide sacrifice layer 100 along with the photoresist pattern 100a is removed by a lift-off process. Thus, the support electrode layer 101 is buried in ohmic contact holes (openings) of the porous silicon oxide sacrifice layer 100.

Figure 9D:
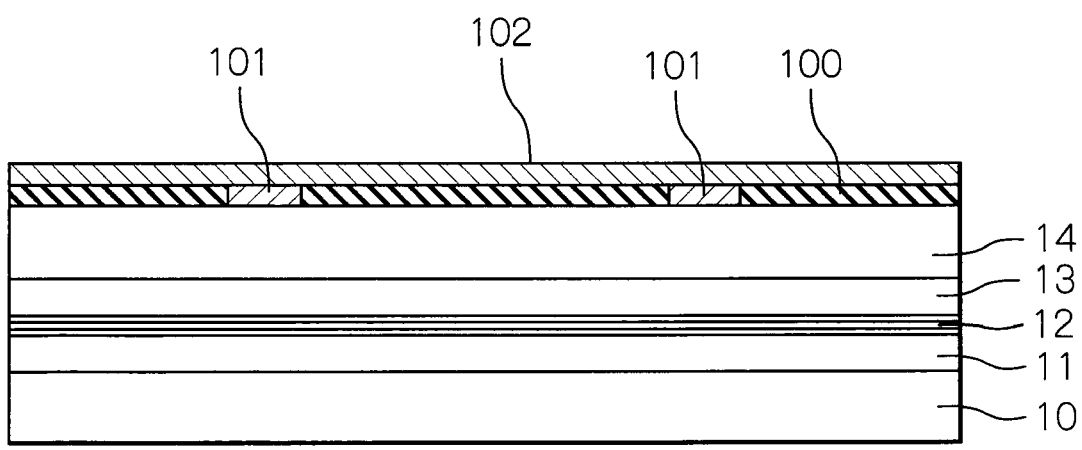

Next, referring to FIG. 9D, a reflective electrode layer 102 made of Ag, Al, or Au is deposited by a resistance heating process, an EB evaporating process or a sputtering process on the porous silicon oxide sacrifice layer 100 and the support electrode layer 101. Note that the support electrode layer 101 has ohmic contact characteristics with the GaInP current spreading layer 14 and the reflective electrode layer 102, and supports the semiconductor layers 11 to 14.

Figure 9E:
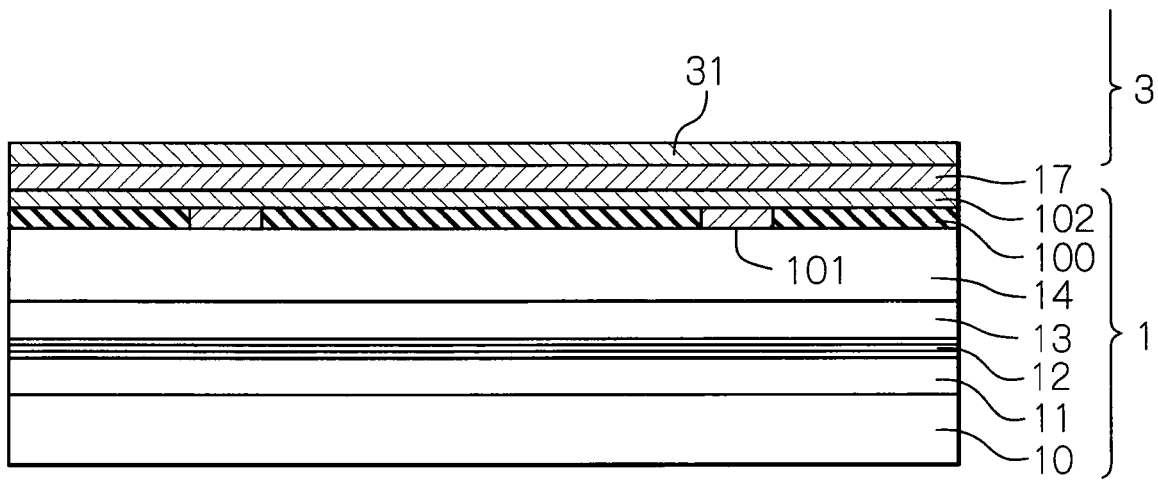

Next, referring to FIG. 9E, a barrier layer 17 and an adhesive layer 31 are sequentially deposited on the reflective electrode layer 102 by a resistance heating process, an EB evaporating process or a sputtering process.

The barrier layer 17 is made of refractory metal such as Ta, Ti or W, or their nitride. For example, TaN, TiW and TaN each having a thickness of about 100 nm is sequentially deposited. The barrier layer 17 suppresses the outgoing diffusion of material of the reflective electrode layer 102 and the incoming diffusion of eutectic material of the adhesive layer 31. If the barrier layer 17 does not operate effectively, the electrical properties such as the increase of the forward voltage $V_f$ would deteriorate and the reflectivity R of the reflective mirror (101, 102) would be decreased, to thereby decrease the brightness of the device.

The adhesive layer 31 is made of about 200 nm Au. Then, an annealing process is carried out at a temperature of about 500° C. under nitrogen atmosphere. As a result, a good ohmic contact is realized between the GaInP current spreading layer 14 and the support electrode layer 101 at the openings of the porous silicon oxide sacrifice layer 100.

Figure 9F:
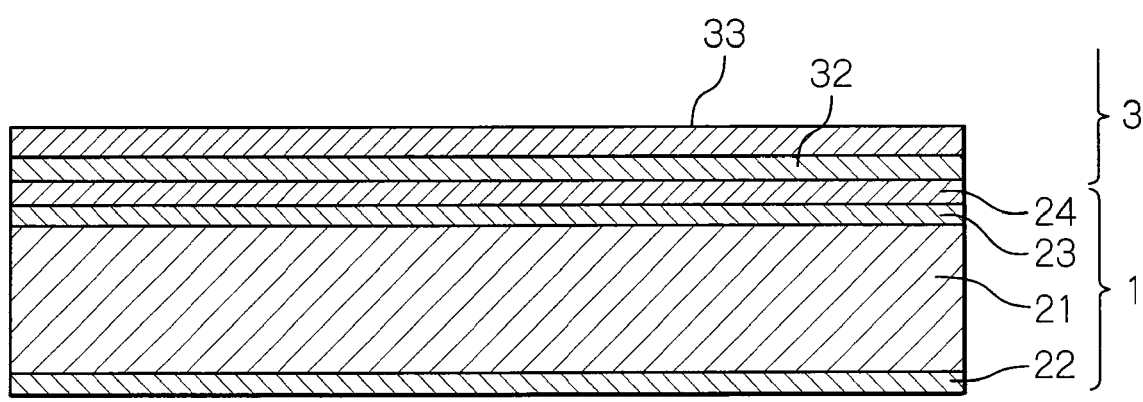

Next, referring to FIG. 9F, a resistance heating process, an EB evaporating process or a sputtering process is carried out, so that a back electrode layer 22 is formed on a face of a conductive support substrate 21, and an intermediate electrode layer 23, a contact layer 24, an adhesive layer 32 and a eutectic bonding layer 33 are sequentially formed on the other face of the conductive support substrate 21.

The conductive support substrate 21 is made of Si, Al or Cu having good thermal conductivity.

Each of the back electrode layer 22 and the intermediate electrode layer 23 has good ohmic contact characteristics with the conductive support substrate 21. For example, each of the back electrode layer 22 and the intermediate electrode layer 23 is an about 100 to 300 nm (for example, 200 nm) thick Pt, Ni or Ti. As occasion demands, an alloy process is carried out under nitrogen atmosphere to realize better ohmic contact characteristics.

The contact layer 24 is made of about 100 to 300 nm (for example, 150 nm) thick Ti, to enhance the contact reliability between the intermediate electrode layer 23 and the adhesive layer 32.

The adhesive layer 32 is made of about 50 to 150 nm (for example, 100 nm) thick Ni, NiV or Pt, to improve the wettability of the adhesive layer 32 at a thermal pressing process.

The eutectic bonding layer 33 is made of about 300 to 3000 nm (for example, 600 nm) thick AuSn where Au:Sn=80 wt %: 20 wt % (=70 at %: 30 at %). In this case, suitable additives can be added to AuSn.

Figure 9G:
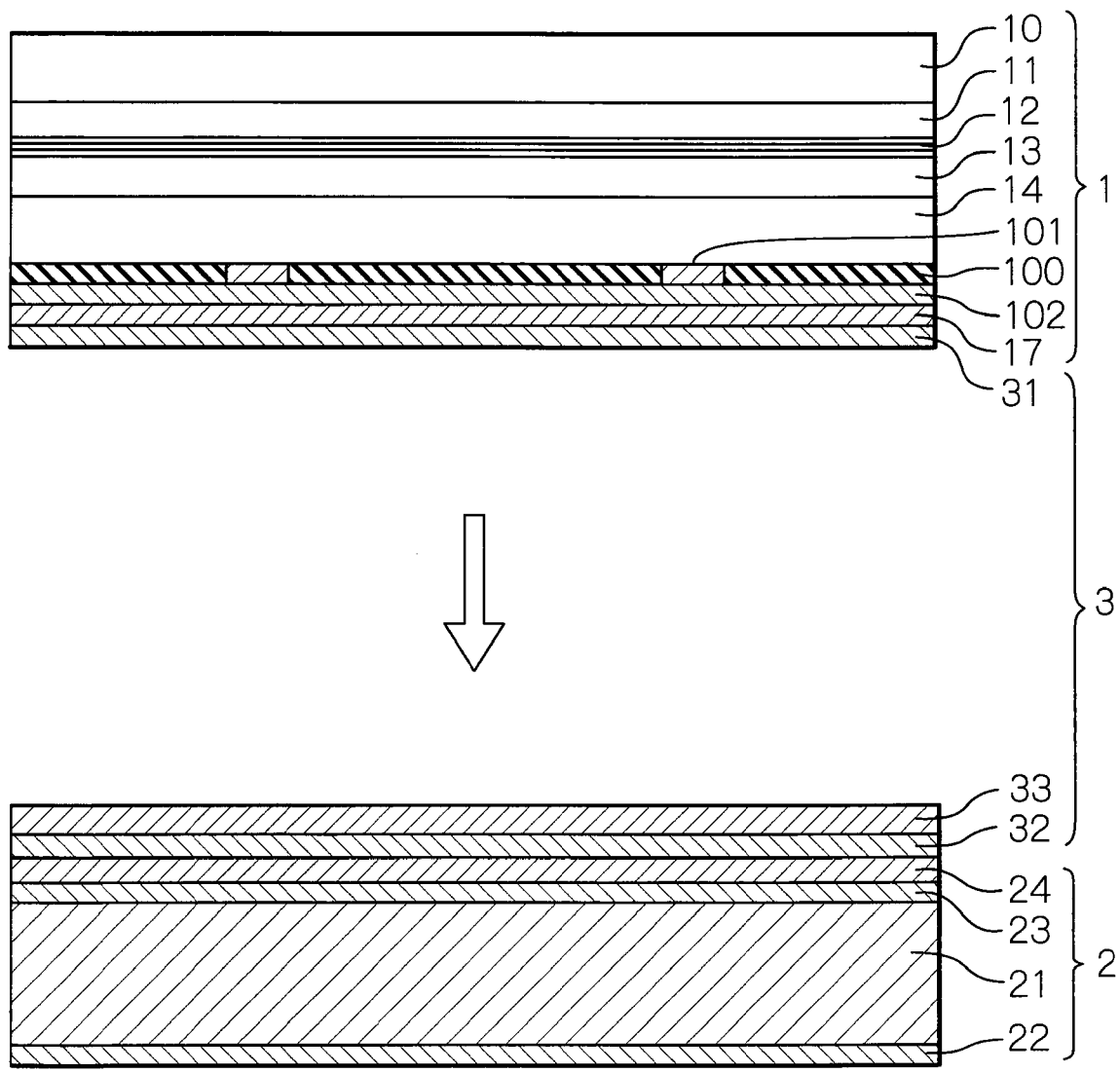
Figure 9H:
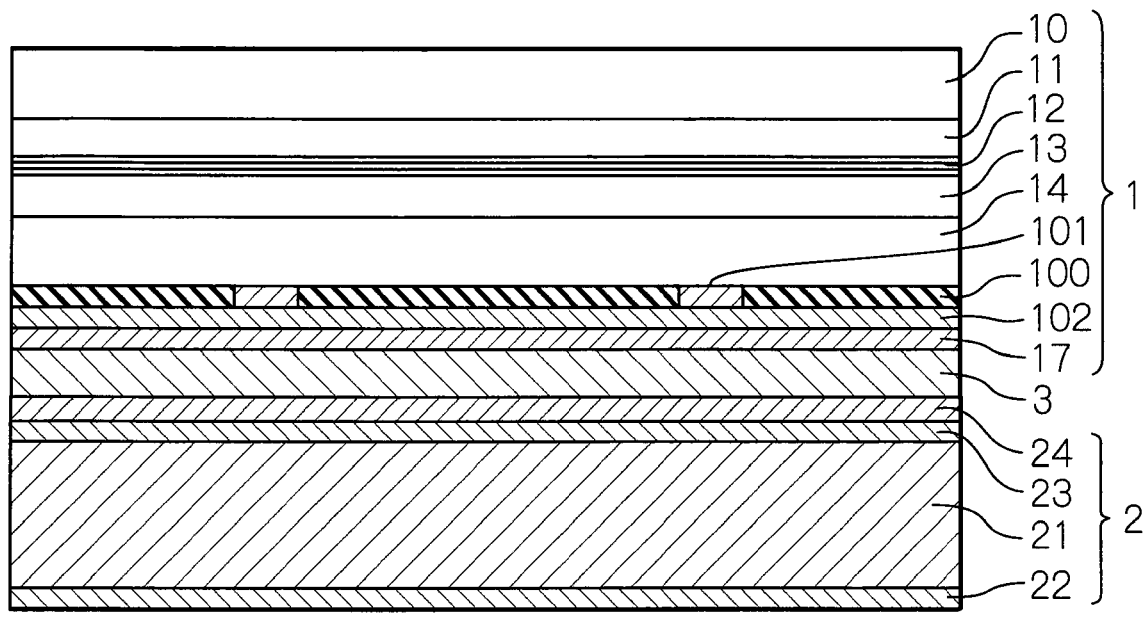

Next, referring to FIG. 9G, the adhesive layer 31 of the semiconductor laminated body 1 is bonded by a thermal pressurizing process to the adhesive layer 32 and the eutectic bonding layer 33 of the support body 2. As a result, as illustrated in FIG. 9H, the adhesive layers 31 and 32 and the eutectic bonding layer 33 are combined into a eutectic bonding layer 3 made of AuSnNi, for example, which is provided between the semiconductor laminated body 1 and the support body 2. In this case, the thermal pressurizing process is carried out at a bonding temperature of about 330° C. under a bonding pressure of about 1 MPa for about ten minutes. Note that the present invention is not limited to the above-mentioned thermal pressurizing conditions such as bonding materials, the bonding temperature, the bonding pressure and the bonding time, as long as the characteristics of the eutectic bonding layer 3 are not affected.

Figure 9I:
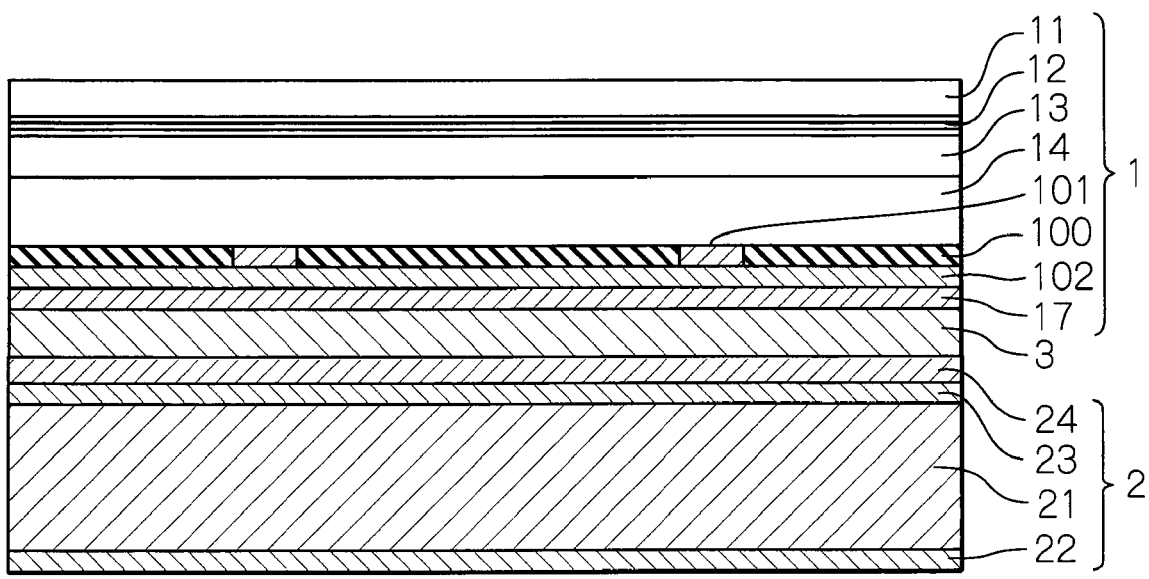

Next, referring to FIG. 9I, the semiconductor growing GaAs substrate 10 is removed by a wet etching process using an etchant of ammonia and hydrogen peroxide. Note that a dry etching process, a mechanical polishing process, a mechanical-chemical polishing (CMP) processor their combined process.

Figure 9J:
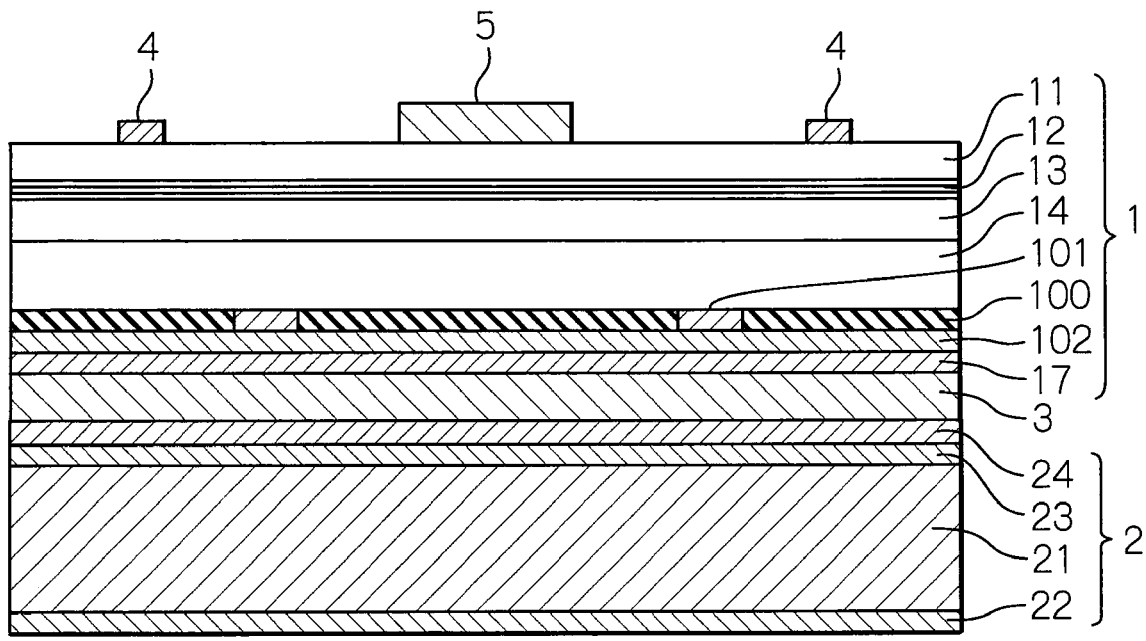

Next, referring to FIG. 9J, an n-side electrode 4 made of AuGeNi having ohmic contact characteristics with AlGaInP is formed by a resistance heating process, an EB evaporating process or a sputtering process, and a lift-off process on the n-type AlGaInP layer 11. In this case, AuGe, AuSn or AuSnNi can be used instead of AuGeNi. Then, a bonding pad 5 made of Au is formed. Then, an annealing process at about 400° C. under nitrogen atmosphere is carried out on the n-side electrode 4 and the bonding pad 5.

Figure 9K:
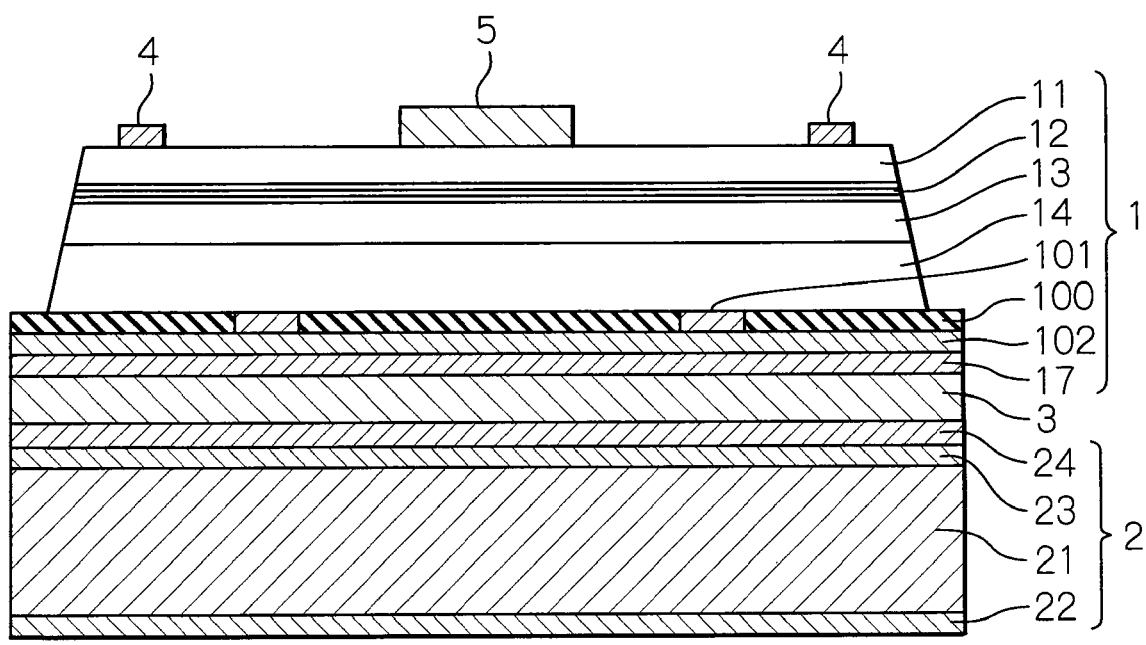

Next, referring to FIG. 9K, the semiconductor layers 11 to 14 are mesa-etched to expose the porous silicon oxide sacrifice layer 100.

Finally, referring to FIG. 5, the porous silicon oxide sacrifice layer 100 is removed by a wet etching process using fluoric acid or hydrochloric acid as an etchant. In this case, since the porous silicon oxide sacrifice layer 100 has voids of several nm to several tens of nm, so that fluoric acid or hydrochloric acid penetrate the interior of the porous silicon oxide sacrifice layer 100 using a capillary phenomenon, the porous silicon oxide sacrifice layer 100 can completely be removed without damaging the semiconductor layers 11 to 14. Then, the support body 2 of the device is diced so that the device is separated into individual chips. Finally, as occasion demands, the entirety of the device is resin-molded (not shown).

In FIG. 10, which illustrates a second embodiment of the optical semiconductor device according to the presently disclosed subject matter, the non-closed loop type support electrode layer 101 of FIG. 5 is replaced by a closed loop type support electrode layer 101' in which a porous silicon oxide sacrifice layer 100' opposing the bonding pad 5 is filled. In this case, an air gap 101a outside of the support electrode layer 101' provides a reflective mirror along with the reflective electrode layer 102.

In FIG. 11, which is a plan view of the support electrode layer 101' of FIG. 10, the support electrode layer 101' is formed by a closed loop structure in which the porous silicon oxide sacrifice layer 100' is filled. That is, the support electrode layer 101' is constructed so as to surround the porous silicon oxide sacrifice layer 100'. Therefore, the porous silicon oxide sacrifice layer 100' not only supports the semiconductor layers 11 to 14, but also supports the pushing force of the bonding pad 5, which would enhance the mechanical strength of the device. Also, since the porous silicon oxide sacrifice layer 100', which is insulating, is located immediately beneath the bonding pad 5, currents are hardly concentrated immediately beneath the bonding pad 5. If currents are concentrated immediately beneath the bonding pad 5, the current density around the bonding pad 5 is decreased, and also, it is impossible to extract light emitted immediately beneath the bonding pad 5.

The manufacturing method of the optical semiconductor device of FIG. 10 is the same as that of the optical semiconductor device of FIG. 5, except that a closed loop type photoresist pattern 100a' and a closed loop type support electrode layer 101' are formed instead of the non-closed loop type photoresist pattern 100a and the non-closed loop type support electrode layer 101, as illustrated in FIG. 12.

Figure 13:
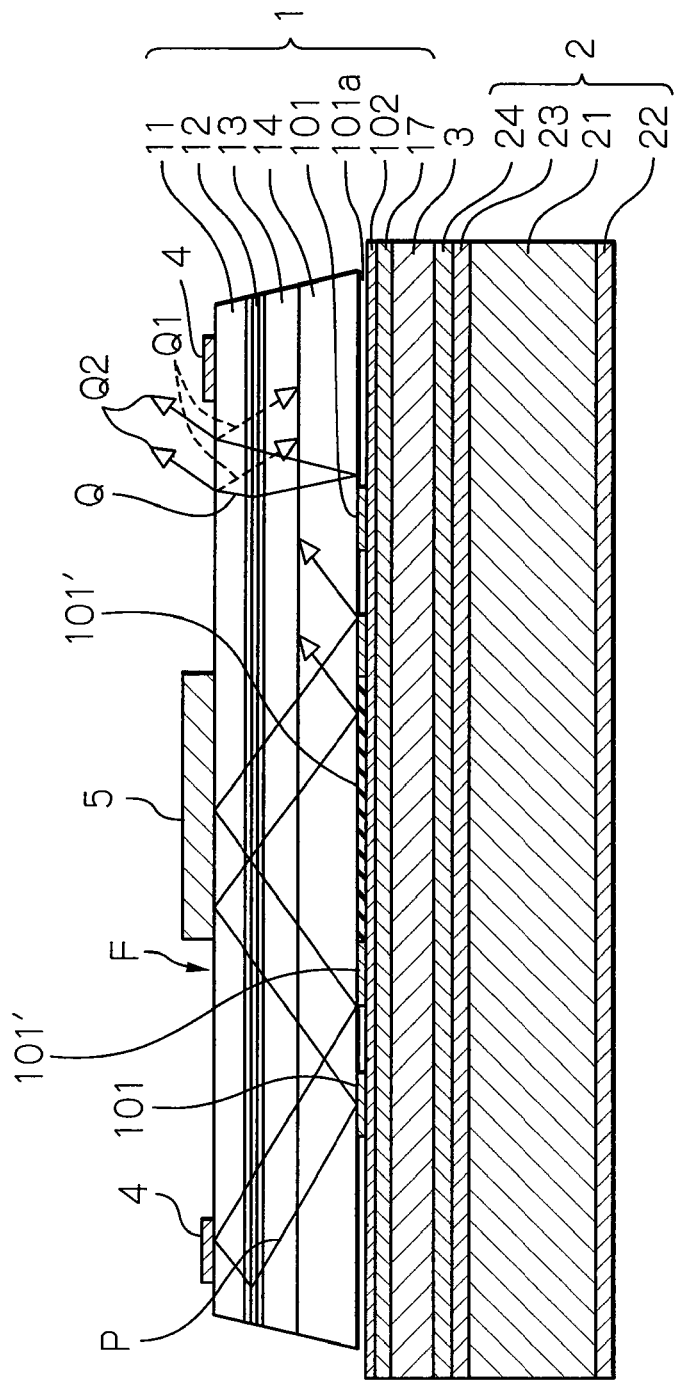
FIG. 13 is a cross-sectional view illustrating a third embodiment of the optical semiconductor device according to the presently disclosed subject matter.

In FIG. 13, which illustrates a third embodiment of the optical semiconductor device according to the presently disclosed subject matter, the non-closed loop type support electrode layer 101 of FIG. 5 and the closed loop type support electrode layer (block layer) 101' of FIG. 10 are provided, and in addition, a porous silicon oxide sacrifice layer 100' is filled in the support electrode layer 101' opposing the bonding pad 5. Therefore, an air gap 101a outside of the support electrode layers 101 and 101' along with the reflective electrode layer 102 serves as a reflective mirror.

Figure 14:
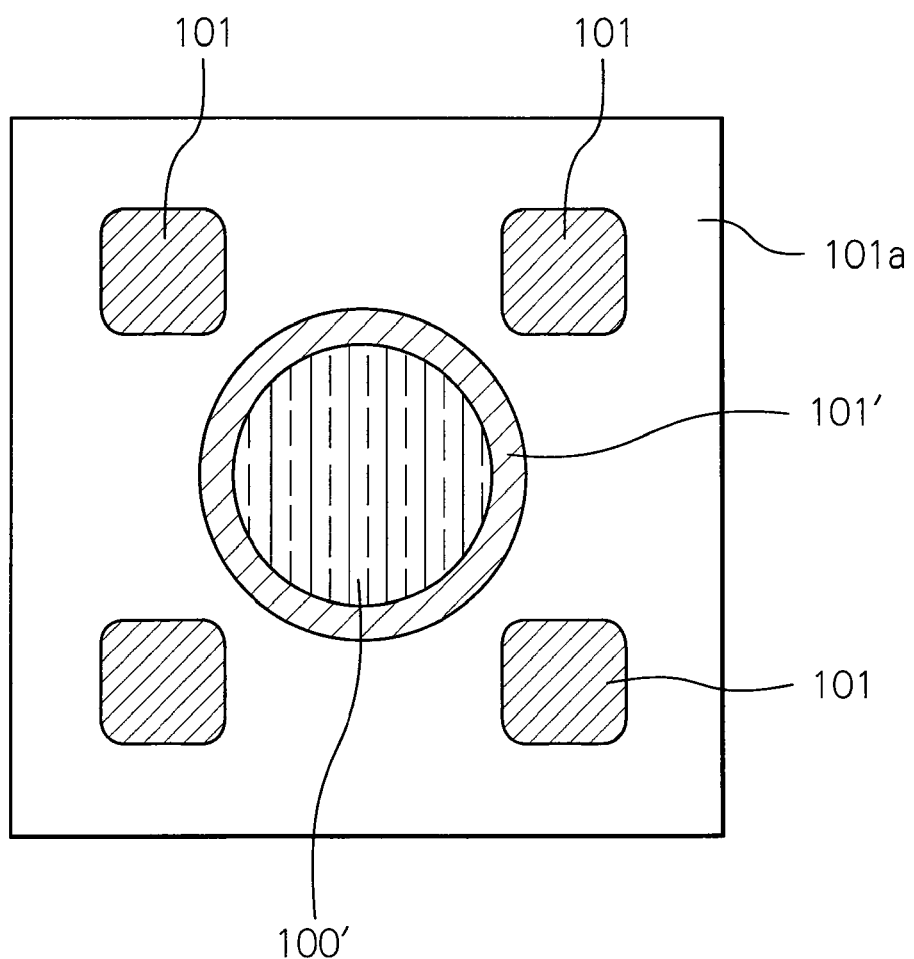
FIG. 14 is a plan view of the support electrode layer of FIG. 13.
Figure 15:
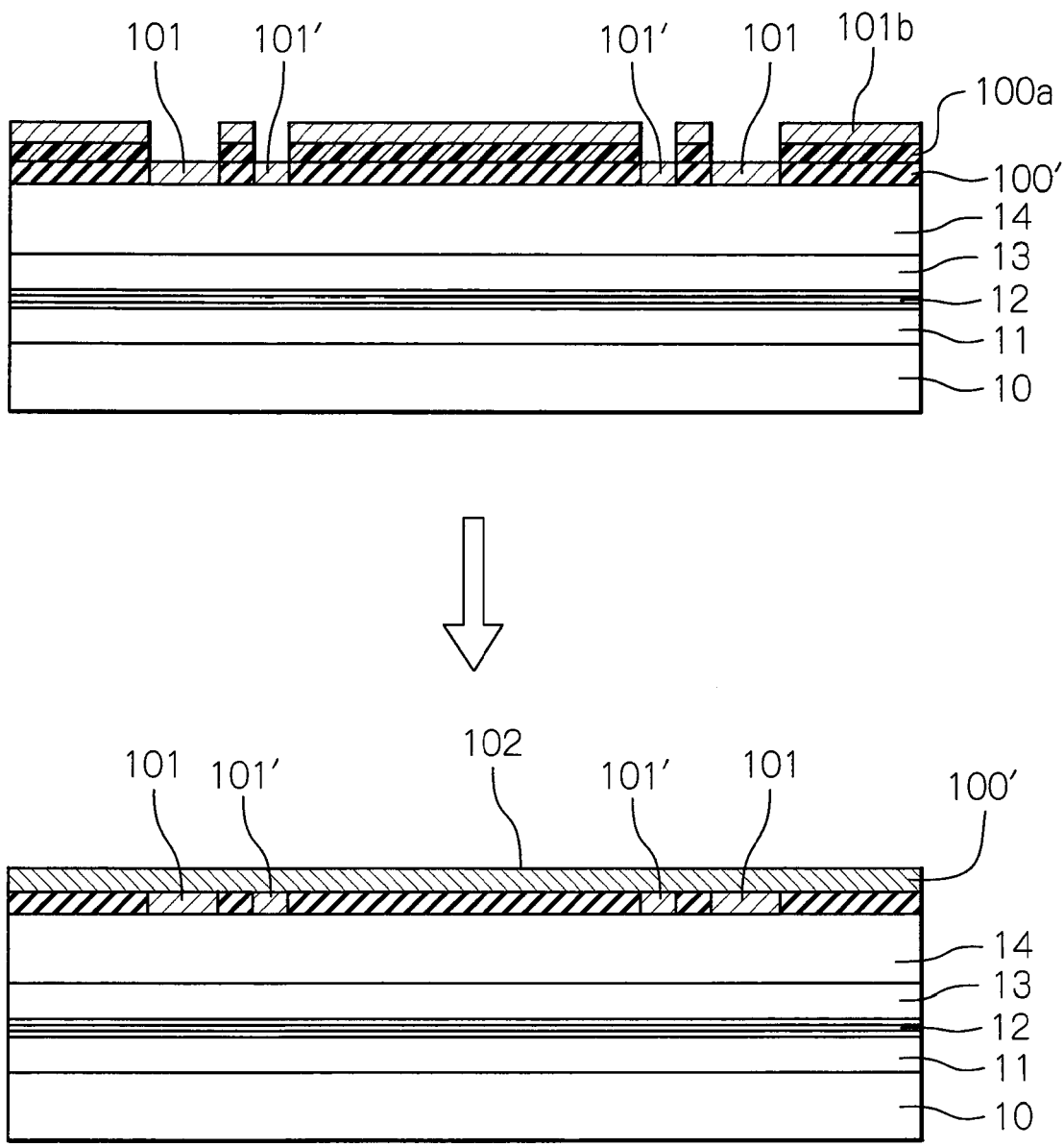
FIG. 15 is a cross-sectional view for explaining a method for manufacturing the optical semiconductor device of FIG. 14.

In FIG. 15, which is a plan view of the support electrode layers 101 and 101' of FIG. 14, the support electrode layer 101' is formed by a closed loop structure in which the porous silicon oxide sacrifice layer 100' is filled. That is, the support electrode layer 101' is constructed so as to surround the porous silicon oxide sacrifice layer 100'. Therefore, the porous silicon oxide sacrifice layer 100' not only supports the semiconductor layers 11 to 14, but also supports the pushing force of the bonding pad 5, which would enhance the mechanical strength of the device.

The manufacturing method of the optical semiconductor device of FIG. 13 is the same as that of the optical semiconductor device of FIG. 5, except that a closed loop type photoresist pattern 100a' and a closed loop type support electrode layer 101' are formed instead of the non-closed loop type photoresist pattern 100a and the non-closed loop type support electrode layer 101, as illustrated in FIG. 15.

In FIGS. 13, 14 and 15, note that since the non-closed loop type support electrode layer 101 is present, the closed loop type support electrode layer 101' does not need to be ohmic metal. In this case, an insulating block layer such as a silicon nitride layer which has etching selectivity against the porous silicon oxide sacrifice layer 100' is provided. However, a step for forming the insulating block layer is added.

The present invention can also be applied to other semiconductor materials such as AlGaAs or GaN than AlGaInP.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

What is claimed is:

1. An optical semiconductor device comprising:
an epitaxially-grown light emitting semiconductor layer;
a reflective electrode layer provided at a counter face of said light emitting semiconductor layer opposing a light extracting face thereof; and
a support electrode layer provided between said reflective electrode layer and the counter face of said light emitting semiconductor layer,
wherein the support electrode layer supports said light emitting semiconductor layer and electrically connects said light emitting semiconductor layer to said reflective electrode layer,
wherein said reflective electrode layer is provided beneath said support electrode layer when viewed in plan view,
wherein a total area of said support electrode layer is smaller than an area of said reflective electrode layer, so that an air gap is provided at a periphery of said support electrode layer between said reflective electrode layer and the counter face of said light emitting semiconductor layer, and
wherein said air gap and said reflective electrode layer together operate as a reflective mirror.

2. The optical semiconductor device as set forth in claim 1, wherein said support electrode layer is of a non-closed structure.

3. The optical semiconductor device as set forth in claim 1, wherein said support electrode layer is of a closed loop structure in which porous silicon oxide is filled.

4. The optical semiconductor device as set forth in claim 3, further comprising a bonding pad formed on the light extracting face of said light emitting semiconductor layer, said porous silicon oxide layer opposing said bonding pad.

5. An optical semiconductor device comprising:
an epitaxially-grown light emitting semiconductor layer;
a bonding pad formed on a light extracting face of said light emitting semiconductor layer;
a reflective electrode layer provided at a counter face of said light emitting semiconductor layer opposing the light extracting face thereof;
a non-closed loop type support electrode layer provided between said reflective electrode layer and the counter face of said light emitting semiconductor layer, said non-closed loop type support electrode layer supporting said light emitting semiconductor layer and electrically connecting said light emitting semiconductor layer to said reflective electrode layer; and
a closed loop type block layer provided between said reflective electrode layer and the counter face of said light emitting semiconductor layer, said closed loop type block layer supporting said light emitting semiconductor layer opposing said bonding pad;
wherein said reflective electrode layer is provided beneath both of said non-closed loop type support electrode layer and said closed loop type block layer when viewed in plan view,
wherein a total area of said non-closed loop type support electrode layer and said closed loop type block layer is smaller than an area of said reflective electrode layer, so that an air gap is provided at peripheries of said support electrode layer and said block layer between said reflective electrode layer and the counter face of said light emitting semiconductor layer, and
wherein said air gap and said reflective electrode layer together operate as a reflective mirror.

6. The optical semiconductor device as set forth in claim 5, wherein said closed loop type block layer comprises the same material as that of said non-closed loop type support electrode layer.

7. The optical semiconductor device as set forth in claim 5, wherein said closed loop type block layer comprises an insulating material.

8. The optical semiconductor device as set forth in claim 7, wherein said insulating material is porous silicon oxide.

\* \* \* \* \*